(12) United States Patent
Ji

(10) Patent No.: US 10,928,471 B2
(45) Date of Patent: Feb. 23, 2021

(54) SYSTEMS AND METHODS FOR DATA TRANSMISSION IN IMAGING SYSTEM

(71) Applicant: SHANGHAI UNITED IMAGING HEALTHCARE CO., LTD., Shanghai (CN)

(72) Inventor: Ling Ji, Shanghai (CN)

(73) Assignee: SHANGHAI UNITED IMAGING HEALTHCARE CO., LTD., Shanghai (CN)

(\*) Notice: Subject to any disclaimer, the term of this patent is extended or adjusted under 35 U.S.C. 154(b) by 0 days.

(21) Appl. No.: 16/424,550

(22) Filed: May 29, 2019

(65) Prior Publication Data

US 2020/0241091 A1 Jul. 30, 2020

(30) Foreign Application Priority Data

Jan. 28, 2019 (CN) .......................... 201920141579.1

(51) Int. Cl.
| | |
|---|---|
| *G01V 3/00* | (2006.01) |
| *G01R 33/36* | (2006.01) |
| *G06T 11/00* | (2006.01) |
| *G01R 33/34* | (2006.01) |
| *G01R 33/30* | (2006.01) |

(52) U.S. Cl.
CPC ....... *G01R 33/3692* (2013.01); *G01R 33/307* (2013.01); *G01R 33/34007* (2013.01); *G06T 11/005* (2013.01); *G06T 2210/41* (2013.01)

(58) Field of Classification Search
CPC .............. G01R 33/5608; G01R 33/543; G01R 33/3815; G01R 33/3804; G01R 33/385; A61B 5/055

USPC ........................................................ 324/322
See application file for complete search history.

(56) References Cited

U.S. PATENT DOCUMENTS

| | | | | |
|---|---|---|---|---|
| 2003/0162415 | A1\* | 8/2003 | Spaulding | H01R 24/28 439/34 |
| 2005/0107681 | A1\* | 5/2005 | Griffiths | G01R 33/567 600/410 |
| 2010/0059640 | A1\* | 3/2010 | Helgesen | F16M 11/2014 248/205.1 |
| 2013/0062961 | A1\* | 3/2013 | Park | H02J 50/90 307/104 |
| 2013/0069644 | A1\* | 3/2013 | Cho | G01R 33/36 324/309 |
| 2013/0156374 | A1\* | 6/2013 | Wu | G02B 6/4201 385/33 |
| 2013/0192875 | A1\* | 8/2013 | Driemel | H02G 15/007 174/135 |

(Continued)

*Primary Examiner* — Walter L Lindsay, Jr.
*Assistant Examiner* — Frederick Wenderoth
(74) *Attorney, Agent, or Firm* — Metis IP LLC

(57) ABSTRACT

Systems and methods for data transmission may be provided. The system may at least include a data transmission module. The system may obtain MR signals from one or more RF coils. The system may generate, via a first portion of the data transmitting module, first data based on the MR signals. The system may generate, via a second portion of the data transmitting module, second data based on the first data. The second portion of the data transmitting module may connect to the first portion of the data transmitting module wirelessly. The system may further store the second data in a non-transitory computer-readable storage medium.

19 Claims, 9 Drawing Sheets

(56) References Cited

U.S. PATENT DOCUMENTS

2016/0033591 A1* 2/2016 Leussler .......... G01R 33/34053
   324/309
2016/0173886 A1* 6/2016 Bae ..................... H04N 19/147
   382/166
2016/0336789 A1* 11/2016 Hyun ..................... H01F 38/14

* cited by examiner

SYSTEMS AND METHODS FOR DATA TRANSMISSION IN IMAGING SYSTEM

CROSS-REFERENCE OF RELATED APPLICATIONS

This application claims priority of Chinese Patent Application No. CN 201920141579.1, filed on Jan. 28, 2019, the contents of which are hereby incorporated by reference.

TECHNICAL FIELD

The present disclosure generally relates to an imaging system, and more particularly, relates to a data transmission in an imaging system.

BACKGROUND

Magnetic resonance imaging (MRI) has been widely used in medical diagnosis, radiation therapy planning, surgery planning, and other medical procedures. The MRI technology makes use of one or more gradient pulses to encode spatial information to MR signals for reconstructing images. The MR signals may be collected by one or more radio frequency (RF) coils (e.g., local coils or volume coils). In some embodiments, the RF coils may need to transmit the MR signals to an MRI device via one or more RF connectors or one or more cables. During the process of data transmission, some noises may be added to the MR signals, which may negatively impact the quality of an MR image reconstructed based on the MR signals. Thus, it may be desirable to develop systems and methods for efficient data transmission in such an imaging system.

SUMMARY

In a first aspect of the present disclosure, a system is provided. The system may be implemented on a magnetic resonance imaging (MRI) device including one or more radio frequency (RF) coils configured to detect magnetic resonance (MR) signals, and a couch configured to support at least portion of a subject. The system may include a storage device including a set of instructions, a data transmitting module and at least one processor. The at least one processor may communicate with the storage device and the data transmitting module. When executing the set of instructions, the at least one processor may direct the system to perform one or more operations as follows. The MR signals may be obtained from the one or more RF coils. A first portion of the data transmitting module may generate first data based on the MR signals. A second portion of the data transmitting module may generate second data based on the first data. The second portion of the data transmitting module may connect to the first portion of the data transmitting module wirelessly. The second data may be stored in a non-transitory computer-readable storage medium.

In some embodiments, the at least one processor may direct the system to transmit the second data to an image processing module connected to the MRI device. The image processing module may be configured to reconstruct an MR image of the at least portion of the subject based on the second data.

In some embodiments, the second portion of the data transmitting module may connect to the first portion of the data transmitting module via optical wireless communication or electronic wireless communication.

In some embodiments, the first portion of the data transmitting module may include a first capacitor coupled with an encoder and a driver. The second portion of the data transmitting module may include a second capacitor coupled with a comparator and a decoder. The second capacitor and the first capacitor may be disposed oppositely and operably coupled with each other.

In some embodiments, the first portion of the data transmitting module may include a light emitting element operably coupled with an electrical to optical converter and one or more lens, and second portion of the data transmitting module may include a light receiving element operably coupled with a fiber bundle and an optical to electrical converter.

In some embodiments, the first portion of the data transmitting module may be operably connected to each of the one or more RF coils, and the first portion of the data transmitting module may be coupled to an RF coil device including the one or more RF coils.

In some embodiments, the RF coil device may move along a table of the couch at any angle and be detachably connected to the couch.

In some embodiments, the RF coil device may be connected to the couch via a connecting element having a guide slot, wherein an angle between the guide slot and the table of the couch ranges from 0 degree to 90 degrees.

In some embodiments, the RF coil device may be electrically connected to the couch via the metallic guide pillar.

In some embodiments, the second portion of the data transmitting module may be coupled to the couch.

In some embodiments, the first portion of the data transmitting module or the second portion of the data transmitting module may include a wireless charging element configured to supply electric power to data transmitting module or the RF coils.

In a second aspect of the present disclosure, a data transmission device is provided. The data transmission device may include a signal converter for converting MR signals from one or more radio frequency (RF) coils, a contactless signal transmitter for wirelessly transmitting the converted signals to a contactless signal receiver, the contactless signal receiver for transmitting the received converted signals to a signal resolver, and the signal resolver for resolving the converted signals to obtain the MR signals. The signal converter may be connected to the one or more RF coils and the contactless signal transmitter. The contactless signal receiver may be connected to the signal resolver. The signal converter and the contactless signal transmitter may be coupled to an RF coil device including the one or more RF coils. The contactless signal receiver and the signal resolver may be coupled to a couch.

In some embodiments, the contactless signal transmitter may include a first capacitor and the contactless signal receiver may include a second capacitor. The converted signals may be wirelessly transmitted under an induced electrical field between the first capacitor and the second capacitor.

In some embodiments, the signal converter may include an encoder and a driver. The encoder may be configured to convert the MR signals to binary data. The driver may be configured to generate waveform signals corresponding to the binary data, and transmit the waveform signals to the first capacitor.

In some embodiments, the signal resolver may include a comparator and a decoder. The comparator may be configured to restore the waveform signals from the second capacitor to digital signals. The decoder may be configured to resolve the digital signals to obtain the MR signals.

In some embodiments, the signal converter may include an electrical to optical converter. The contactless signal transmitter may include one or more lens. The contactless signal receiver may include a fiber bundle, and the signal resolver may include an optical to electrical converter. The electrical to optical converter may be configured to convert the MR signals to optical signals. The one or more lens may be configured to focus the optical signals. The fiber bundle may be configured to transmit the focused optical signals. The optical to electrical converter may be configured to convert the focused optical signals to electrical signals indicative of the MR signals.

In some embodiments, the RF coil device is detachably connected to the couch.

In some embodiments, the RF coil device may include one or more electric conductors configured to electrically connect to the couch.

In a third aspect of the present disclosure, a magnetic resonance imaging (MRI) device is provided. The MRI device may include a couch for supporting a subject, a radio frequency (RF) coil device for detecting MR signals from at least one portion of the subject, a contactless signal transmitter disposed in the RF coil device, and a contactless signal receiver disposed in the couch. The RF coil device may include one or more RF coils, and the RF coil device is detachably connected to the couch. The contactless signal transmitter may be configured to transmit the MR signals to the contactless signal receiver according to an electrical field or an optical field between the contactless signal transmitter and the contactless signal receiver.

In some embodiments, the MRI device may include a signal converter disposed in the RF coil device and a signal resolver disposed in the couch. The signal converter may be configured to convert MR signals from one or more RF coils. The contactless signal transmitter may be configured to wirelessly transmit the converted signals to the contactless signal receiver. The contactless signal receiver may be configured to transmit the received converted signals to the signal resolver. The signal resolver may be configured to resolve the received converted signals to obtain the MR signals.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the present disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

The terminology used herein is for the purpose of describing particular exemplary embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including", when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," and/or "module" used herein are one method to distinguish different components, elements, parts, section or assembly of different level in ascending order. However, the terms may be displaced by another expression if they achieve the same purpose.

Figure 1:
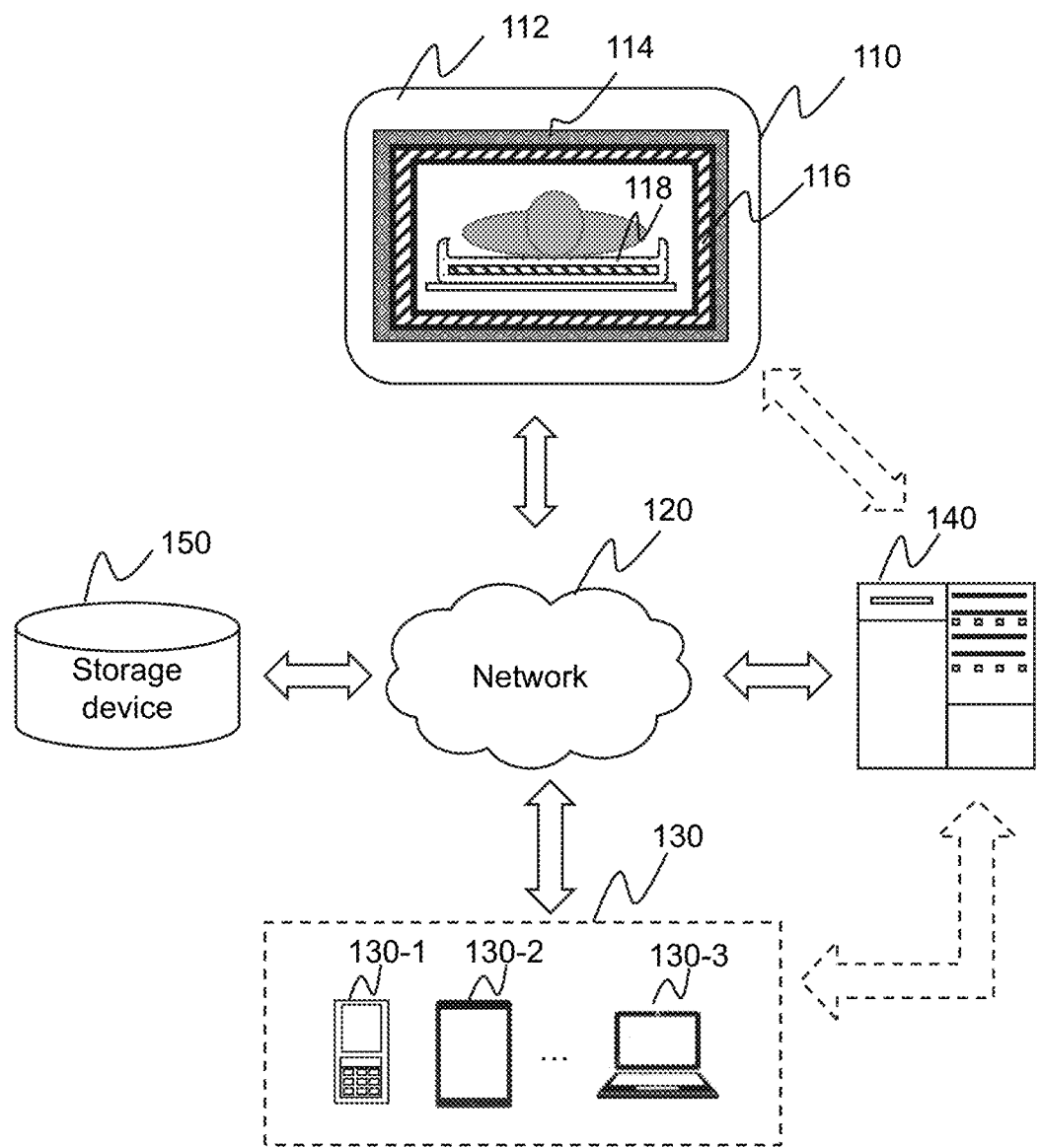
FIG. 1 is a schematic diagram illustrating an exemplary MRI system according to some embodiments of the present disclosure.

Generally, the word "module" or "unit" as used herein, refers to logic embodied in hardware or firmware, or to a collection of software instructions. A module or a unit described herein may be implemented as software and/or hardware and may be stored in any type of non-transitory computer-readable medium or another storage device. In some embodiments, a software module/unit may be compiled and linked into an executable program. It will be appreciated that software modules can be callable from other modules/units or themselves, and/or may be invoked in response to detected events or interrupts. Software modules/ units configured for execution on computing devices (e.g., processing device 140 as illustrated in FIG. 1) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units may be included in connected logic components, such as gates and flip-flops, and/or can be included of programmable units, such as programmable gate arrays or processors. The modules/units or computing device functionality described herein may be implemented as software modules/units but may be represented in hardware or firmware. In general, the modules/units described herein refer to logical modules/units that may be combined with other modules/units or divided into sub-modules/sub-units despite their physical organization or storage. The description may apply to a system, an engine, or a portion thereof.

It will be understood that when a unit, engine or module is referred to as being "on," "connected to," or "coupled to," another unit, engine, or module, it may be directly on, connected or coupled to, or communicate with the other unit, engine, or module, or an intervening unit, engine, or module may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of the present disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical imaging system may include a single modality imaging system and/or a multi-modality imaging system. The single modality imaging system may include, for example, a magnetic resonance imaging (MRI) system. Exemplary magnetic resonance imaging (MRI) system may include a superconducting magnetic resonance imaging device, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

For illustration purposes, the disclosure describes systems and methods for MRI medical applications (e.g., MRI imaging, MRI guided radiotherapy treatment, etc.). It should be noted that the MRI system 100 described below is merely provided for illustration purposes, and not intended to limit the scope of the present disclosure.

The various embodiments of the present disclosure may be provided as an MRI system configured to generate an MR image. In some embodiments, the MRI system may include a data transmitting module for transmitting MR signals from one or more RF coils to an image processing system of the MRI system. The one or more RF coils may be configured to detect the MR signals of at least one portion of a subject. The image processing system may be configured to reconstruct the MR image based on the received MR signals. In some embodiments, the data transmitting module may include one or more coil side data transmission components and one or more couch side data transmission components. The one or more coil data transmission components may send the MR signals to the one or more couch side data transmission components via an optical and/or electronic wireless communication. These wireless communication mechanisms may provide efficient and/or accurate data transmission, thereby improving the quality of a reconstructed MR image. Moreover, the wireless communication mechanisms for data transmission may simplify the mechanical and electronic portions of MRI system by, e.g., reducing the wiring between the one or more RF coils and a data receiving component communicated with the image processing system of the MRI system.

For example, during scanning, the subject may be moved to a uniform magnetic field by a couch supporting the subject. Under the effect of the magnetic field, the spins of nuclei (e.g., 1H, 19F, 31P, etc.) carrying positive charges in the subject may align with the magnetic field. Nuclei spins are usually randomly oriented; however, the nuclei spins may change to align when the magnetic field is applied to the subject. Larmor precession of a nucleus may occur along an angle between the spin axis and the direction of the magnetic field. A magnetization vector of the spin system may gradually increase from zero. When the spin system reaches equilibrium, the intensity of the magnetization may reach a constant value. If the spin system is subjected to a specific external trigger signals at this time, for example, a radio frequency (RF) pulse of a same frequency as the Larmor frequency of the nuclei, nuclei may be excited, which may cause a resonance effect. In some embodiments, an RF generation unit of the MR device may generate the RF pulses. The RF pulses may be amplified by an amplifier. When the body coil receives the RF pulses, the body coil may emit the RF pulses toward the subject. The spins of nuclei may align with the direction of the RF, e.g., the nutation. When the RF pulses stop, the excited atomic nuclei in the spin system may not maintain the nutation, and may have a tendency to return to the original randomly oriented state. A weak energy may be released accordingly. RF signals may be generated due to the released energy. One or more RF coils (e.g., volume coils or local coils) may receive the RF signals, which are the MR signals corresponding to the nuclei. The one or more RF signals may be transmitted, via the data transmitting module, to an image processing system of the MRI system for further processing.

FIG. 1 is a schematic diagram illustrating an exemplary MRI system according to some embodiments of the present disclosure. As shown in FIG. 1, MRI system 100 may include an MR device 110, a network 120, a terminal 130, a processing device 140, and a storage device 150. The connection between the components in the MRI system 100 may be any one or more of variable ways. Merely by way of example, as illustrated in FIG. 1, the MR device 110 may be connected to the processing device 140 through the network 120. In some embodiments, the MR device 110 may be connected to the processing device 140 directly.

The MR device 110 may scan at least one portion of a subject. The subject may be biological or non-biological. Merely by way of example, the subject may include a patient, a man-made object, etc. As another example, the subject may include a specific portion, organ, and/or tissue of the patient. For example, the subject may include the head, the brain, the neck, body, a shoulder, an arm, the thorax, the heart, the stomach, a blood vessel, soft tissue, a knee, a foot, or the like, or any combination thereof, of a patient. In some embodiments, the MR device 110 may generate MR signals related to the at least portion of the subject. In some embodiments, the MR device 110 may generate an MR image based on the MR signals.

As illustrated in FIG. 1, the MR device 110 may include a magnetic body 112, a gradient coil 114, a body coil 116, and a couch 118. In some embodiments, the magnetic body 112, the gradient coil 114, and/or the body coil 116 may be arranged in a gantry of the MR device 110. The gantry is not shown in FIG. 1. In some embodiments, the location of couch 118 in the MR device 110 may be adjustable. For example, the location of the couch 118 may be adjusted manually by a user (e.g., a patient, a doctor, a nurse, etc.) or automatically according to an instruction of a user or the MRI system 100. In some embodiments, the location of the couch 118 may be adjusted according to the location of a radiation beam (e.g., X-rays, electron rays, photon rays, etc.) in a treatment procedure. The radiation beam may be generated by a treatment apparatus (not shown). As used herein, the treatment apparatus may refer to an apparatus configured to apply a radiation therapy to a subject placed in the MRI system 100. In some embodiments, the treatment apparatus may be located inside or out of the MRI system 100.

The magnetic body 112 may generate a static magnetic field during the scanning of the at least one portion of the subject. As used herein, the static magnetic field may be referred to as a main magnetic field. The magnetic body 112 may be of various types including, for example, a permanent magnet, a superconducting electromagnet, a resistive electromagnet, etc. In some embodiments, the magnetic body 112 may also include a shim component (not shown in FIG. 1). In some embodiments, the shim component is a shim coil. The shim coil may be configured to uniform the static magnetic field. In some embodiments, the magnetic body 112 and the shim coil may be cylinder-shaped. The shim coil may be arranged so as to become coaxial with the magnetic body 112.

Figure 2:
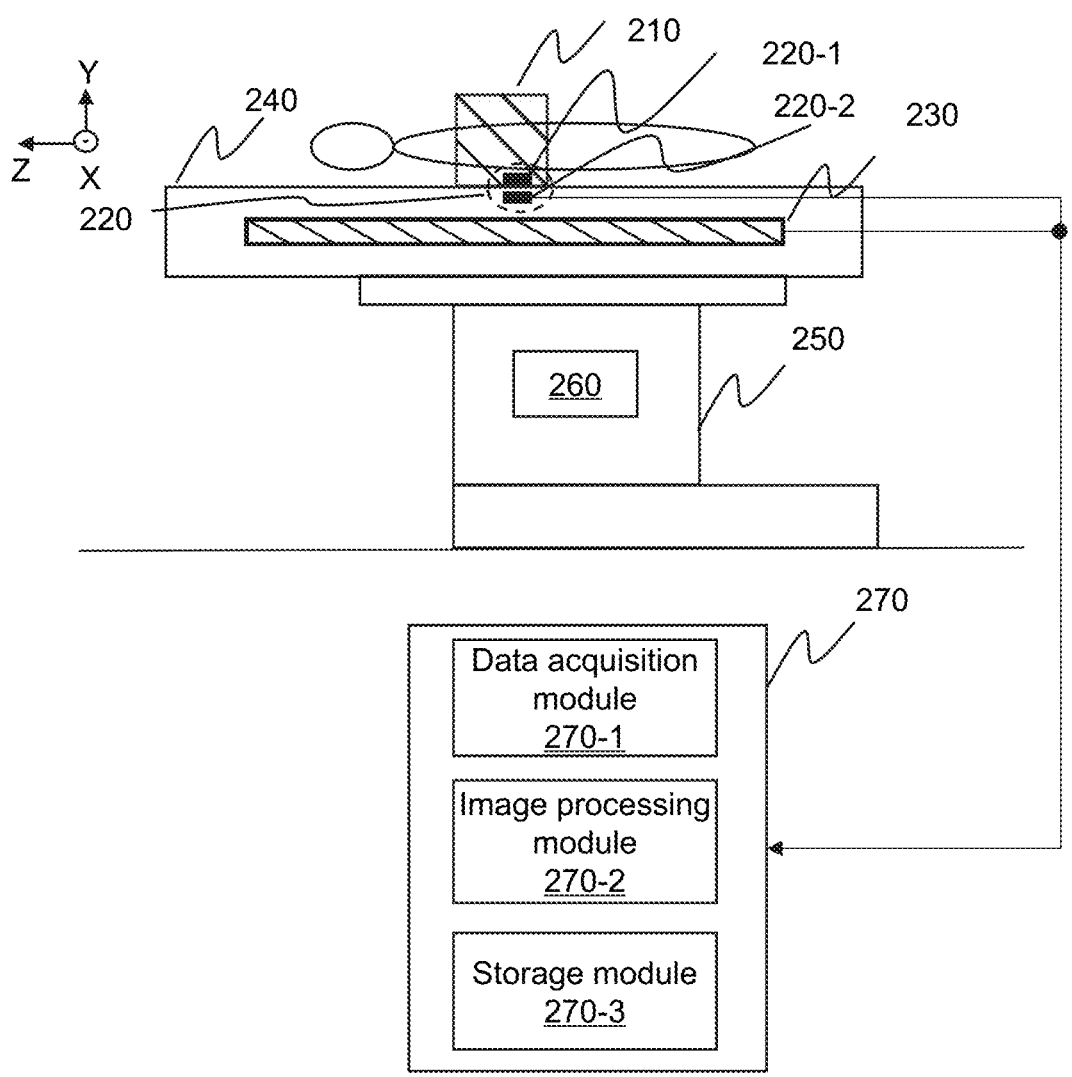
FIG. 2 is a schematic diagram illustrating an exemplary MRI system according to some embodiments of the present disclosure.

The gradient coil 114 may provide magnetic field gradients to the main magnetic field in an X direction, a Y direction, and/or a Z direction (see FIG. 2). As used herein, the X direction, the Y direction, and the Z direction may represent an X axis, a Y axis, and a Z axis in a coordinate system. Merely by way of example, the X axis and the Z axis may be in a horizontal plane, the X axis and the Y axis may be in a vertical plane, the Z axis may be along the axis of the magnetic body 112. In some embodiments, the gradient coil(s) 114 may include an X-direction coil for providing a magnetic field gradient in the X direction, a Y-direction coil for providing a magnetic field gradient in the Y direction, and/or Z-direction coil for providing a magnetic field gradient in the Z direction. In some embodiments, the X-direction coil, the Y-direction coil, and/or the Z-direction coil may be of various shapes and/or configurations. For example, the Z-direction coil may be designed based on a circular (Maxwell) coil. As another example, the X-direction coil and the Y-direction coil may be designed on the basis of the saddle (Golay) coil configuration.

The body coil 116 may emit signals to and/or receive MR signals from at least one portion of a subject being scanned. In some embodiments, the body coil 116 may be an RF coil. The RF coil may be configured to emit RF signals/pulses to the subject being examined. In some embodiments, the body coil 116 may include a transmitting coil and a receiving coil. The transmitting coil may emit signals (e.g., RF signals) that may excite nuclei in the subject. The receiving coil may receive MR signals emitted from the subject. In some embodiments, the RF transmitting coil and the RF receiving coil may be integrated into a single coil. In some embodiments, the body coil 116 may be of various types including, for example, a QD orthogonal coil, a phase-array coil, etc. In some embodiments, the RF receiving coil may also be disposed on the couch 118 for receiving MR signals emitted from the subject. In some embodiments, the RF receiving coil may be integrated to an RF coil device to detect the MR signals.

The couch 118 may be configured to support the at least portion of the subject being scanned, and receive or transmit the MR signals related to the at least portion of the subject. Merely by way of example, the couch 118 may include, for example, a vacuum cushion containing an RF coil, a heat formable cushion containing an RF coil, etc. As another example, the couch 118 may at least include a table 240, a supporting platform 250, and a table driving device 260 as illustrated in FIG. 2. As disclosed herein, the couch 118 may be assumed to be a part of the MR device 110 as shown in FIG. 1. However, a main body of the MR device 110 (e.g., all the components of the MR device 110 excluding the couch 118) and the couch 118 may be regarded as independent structures or units. More descriptions of the couch 118 may be found in elsewhere in the present disclosure (e.g., FIG. 2, and the descriptions thereof).

In some embodiments, the MR device 110 may be a permanent magnet MR device, a superconducting electromagnet MR device, or a resistive electromagnet MR device, etc. In some embodiments, the MR device 110 may be a high-field MRI device, a mid-field MRI device, and a low-field MRI device, etc.

In some embodiments, the MR device 110 may be connected to or communicate with another component of the MRI system 100, e.g., the terminal 130, the processing device 140, and/or the storage device 150. In some embodiments, the MR device 110 may transmit the MR signal and/or image data to the terminal(s) 130, the processing device 140, and/or the storage device 150, via the network 120. For example, the MR device 110 may send an MR signal and/or image data to the processing device 140 for further processing (e.g., for image reconstruction).

The network 120 may include any suitable network that may facilitate the exchange of information and/or data for the MRI system 100. In some embodiments, one or more components of the MRI system 100 (e.g., the MR device 110, the terminal(s) 130, the processing device 140, the storage device 150, etc.) may communicate information and/or data with one or more other components of the MRI system 100 via the network 120. For example, the processing device 140 may obtain MR signals from the MR device 110 via the network 120. As another example, the processing device 140 may obtain user instructions from the terminal(s) 130 via the network 120. The network 120 may be and/or include a public network (e.g., the Internet), a private network (e.g., a local area network (LAN), a wide area network (WAN)), etc.), a wired network (e.g., an Ethernet network), a wireless network (e.g., an 502.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal(s) 130 may include a mobile device 130-1, a tablet computer 130-2, a laptop computer 130-3, or the like, or any combination thereof. In some embodiments, the mobile device 130-1 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 130 may be part of the processing device 140.

The processing device 140 may process data and/or information obtained from the MR device 110, the terminal(s) 130, and/or the storage device 150. For example, the processing device 140 may process MR signals generated by the MR device 110 and encode the MR signals for reconstructing an image. As another example, the processing device 140 may determine a lesion (e.g., a tumor) in the reconstructed image and determine a treatment plan associated with the lesion based on the reconstructed image. In some embodiments, the processing device 140 may be a single server or a server group. The server group may be centralized or distributed. In some embodiments, the processing device 140 may be local or remote. For example, the processing device 140 may access information and/or data stored in the MR device 110, the terminal(s) 130, and/or the storage device 150 via the network 120. As another example, the processing device 140 may be directly connected to the MR device 110, the terminal(s) 130 and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data, instructions, and/or any other information. In some embodiments, the storage device 150 may store data obtained from the terminal(s) 130 and/or the processing device 140. In some embodiments, the storage device 150 may store data and/or instructions that the processing device 140 may execute or use to perform exemplary methods described in the present disclosure. In some embodiments, the storage device 150 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more other components in the MRI system 100 (e.g., the processing device 140, the terminal(s) 130, etc.). One or more components of the MRI system 100 may access the data or instructions stored in the storage device 150 via the network 120. In some embodiments, the storage device 150 may be directly connected to or communicate with one or more other components in the MRI system 100 (e.g., the processing device 140, the terminal(s) 130, etc.). In some embodiments, the storage device 150 may be part of the processing device 140.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. However, those variations and modifications do not depart the scope of the present disclosure. For example, the body coil 116 may be omitted. The function of the body coil 116 (e.g., receiving MR signals and/or emitting RF pulses) may be performed by one or more local coils.

FIG. 2 is a schematic diagram illustrating an exemplary MRI system according to some embodiments of the present disclosure. The MRI system 200 may be the MRI system 100 as shown in FIG. 1. For illustration purposes, one or more components of an MR device (e.g., a magnetic body 112, a gradient coil 114, a body coil 116 illustrated in FIG. 1) of MRI system 200 is not shown in FIG. 2, which may be found elsewhere in the present disclosure, for example, FIG. 1, and the descriptions thereof.

As illustrated in FIG. 2, during the scanning by the MR device, a subject to be examined may be supported by a couch device (e.g., the couch 118). The exemplary couch device may at least include a table 240, a supporting platform 250, and a table driving device 260. The table 240 may be movably supported on the supporting platform 250, and the subject is loaded on the table 240. In some embodiments, the table driving device 260 may be used to drive the table 240 to move. In some embodiments, the table driving device 260 may include one or more driving circuits to generate driving signal(s) to drive the table 240 to move. In some embodiments, the table driving device 260 may drive the table 240 to move to a specified location in response to one or more instructions from the terminal(s) and/or the processing engine. For example, an operator (e.g., a doctor, a technical staff, or a nurse) may preset or adjust the specified location coordinates (e.g., x, y, z) suitable to scan at least part of the subject through a communication interface of the terminal(s) and/or the processing engine. In some embodiments, the table driving device 260 may be disposed inside or outside of the supporting platform 250. The table 240 and the supporting platform 250 may be made of various materials (e.g., metal materials, plastic materials, or rubber materials). In some embodiments, the couch device may be electrically connected to one or more components of the MRI system 200 (e.g., the MR device 110, the terminals 130, or the processing device 140). For instance, the couch device may be electrically driven in response to an instruction from the one or more components of the MRI system 200 (e.g., the MR device 110, the terminals 130, or the processing device 140).

As described in connection with FIG. 1, during the scanning, the magnetic body 112 may generate a static magnetic field. In some embodiments, the generated magnetic field may be uniformed by one or more shim component (not shown in FIG. 1). Example shim components may include one or more shim coils. The gradient coil 114 may provide magnetic field gradients to the main magnetic field in an X direction, a Y direction, and/or a Z direction. The body coil 116 (e.g., referred to as an RF transmitting coil) may emit the RF pulses to penetrate the subject (or at least one portion of the subject). In some embodiments, the body coil 116 (e.g., referred to as an RF receiving coil) may receive or detect corresponding MR signals associated with the subject. The body coil 116 may include volume coil(s) that are used to provide a homogenous RF excitation field across a relatively large volume, such as to cover the entire target body.

In some embodiments, the MRI system 200 may include an RF coil device 210, a data transmitting module 220 (also referred to herein as a data transmission device), an RF receiving coil 230, and an image processing system 270. As illustrated in FIG. 2, the RF coil device 210 may include a wearable local RF coil device for detecting the MR signals associated with the subject. For example, the RF coil device 210 may include a plurality of local coils closely surrounding a region of interest (ROI) of the subject (e.g., the chest, the head, a breast, the spine, a knee, an ankle, etc.). In some embodiments, the plurality of local coils specifically designed for imaging different parts of the subject (e.g., a human body). Merely for illustration, the RF coil device 210 may be designated as a chest RF coil device for detecting MR signals of the chest of the subject. As another example, the RF coil device 210 may be designed as a head coil device for detecting MR signals of the head of the subject. In some embodiments, the RF coil device 210 is detachably connected to the table 240. For example, the RF coil device 210 may include a first connecting element configured to connect the RF coil to a second connecting element of the table 240. The RF coil device 210 may be removed from the table 240 by disconnecting the connecting elements (e.g., the first connecting element and the second connecting element).

In some embodiments, the data transmitting module 220 may include one or more portions configured to wirelessly transmit the MR signals detected by the RF coil device 210. As illustrated in FIG. 2, the data transmitting module 220 may include the first portion of the data transmitting module 220-1 at the coil side (also referred to herein as "coil side data transmitting module"), and the second portion of the data transmitting module 220-2 on the couch side (also referred to herein as "couch side data transmitting module"). In some embodiments, the first portion of the data transmitting module 220-1 may be disposed in the RF coil device 210. The second portion of the data transmitting module 220-2 may be disposed in the table 240 of the couch device. In some embodiments, the first portion of the data transmitting module 220-1 may be arranged on the surface of the RF coil device 210. The second portion of the data transmitting module 220-2 may be arranged on the surface of the table 240 accordingly. The coil side data transmitting module 220-1 may obtain the MR signals detected by the RF coil device 210, and transmit the MR signals to the couch side data transmitting module 220-2 in one or more of various ways of wireless communications (e.g., an optical and/or electronic wireless communication). For example, a near filed communication (NFC) may be implemented by the coil side data transmitting module and the couch side data transmitting module. In some embodiments, the couch side data transmitting module 220-2 may send the received MR signals to a storage device (e.g., the storage device 150) for storing. In some embodiments, the couch side data transmitting module 220-2 may send the received MR signals to the image processing system 270. The image processing system 270 may reconstruct an MR image based on the MR signals. More descriptions of the data transmitting module 220 may be found elsewhere in the disclosure (e.g., FIG. 3, FIGS. 4A-4B, and the descriptions thereof).

In some embodiments, the RF receiving coil 230 may be disposed in the table of the couch device. The RF receiving coil 230 may detect MR signals generated due to excited nuclear spins inside at least one portion of the subject by the RF pulses. The RF receiving coil 230 may transmit the detected MR signals to the image processing system 270. The image processing system 270 may reconstruct an MR image based on the MR signals.

In some embodiments, the image processing system 270 may include a data acquisition module 270-1, an image processing module 270-2, and a storage module 270-3. The image processing system 270 may be used to reconstruct the MR image based on the MR signals. For example, the data acquisition module 270-1 may obtain the MR signals from the couch side data transmitting module 220-2 and/or the RF receiving coil 230. The image processing module may reconstruct the MR image based on the MR signals. The storage module 270-3 may store the reconstructed MR image and/or corresponding MR data.

Figure 6:
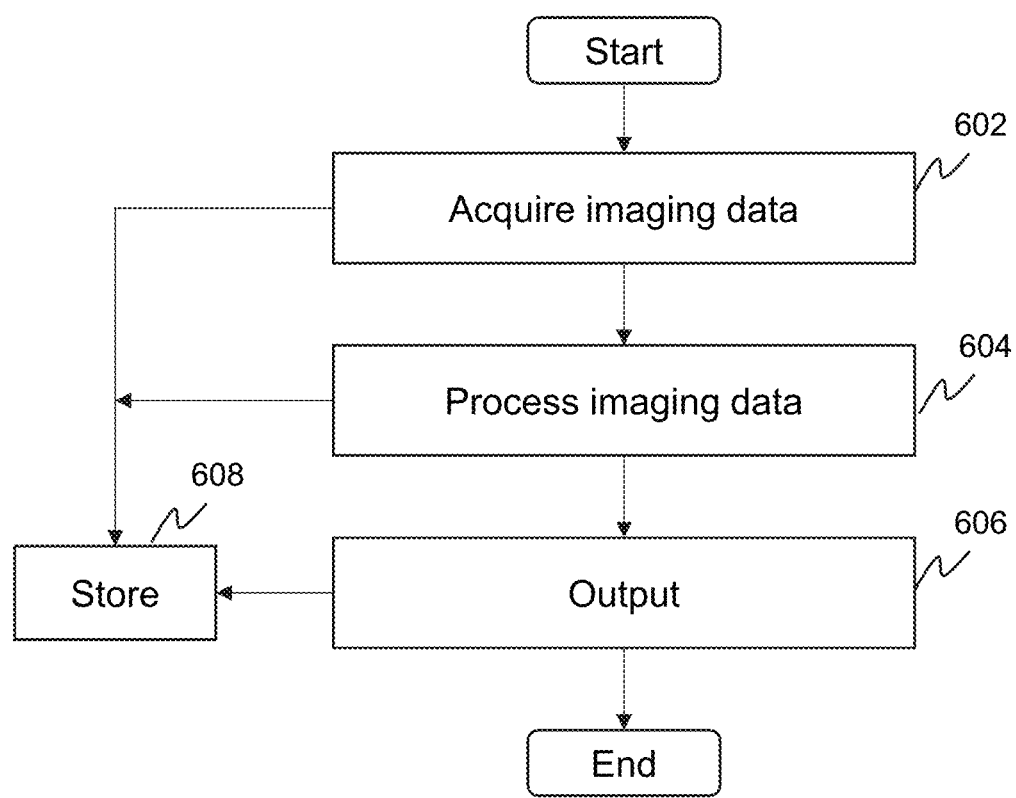
FIG. 6 is a flowchart illustrating an exemplary process for an imaging method according to some embodiments of the present disclosure.

As described in connection with FIG. 6, FIG. 6 illustrates an exemplary process for an imaging method according to some embodiments of the present disclosure. In some embodiments, prior to acquiring imaging data of a target (e.g., the subject or at least one portion of the subject), the MR device 110 and the couch 118 may be adjusted to a suitable position or angle for scanning the subject. The position or angle may be preset or adjusted manually and/or automatically.

In 602, the data acquisition module 270-1 may acquire imaging data (e.g., MR signals) of the target. For example, during a scanning of the target, the RF coil device 210 may detect MR signals generated due to excited nuclear spins inside the target by the RF pulses. The coil side data transmitting module 220-1 inside the RF coil device 210 may wirelessly transmit the detected MR signals to the couch side data transmitting module 220-2 inside the couch device. The data acquisition module 270-1 may obtain the MR signals from the couch side data transmitting module 220-2.

In 604, the image processing module 270-2 may process the acquired imaging data (e.g., the MR signals). In some embodiments, the data processing may include image reconstruction, image correction, and so on. For example, the image processing module 270-2 may reconstruct the image by using the acquired imaging data according to one or more reconstruction algorithms. The reconstruction algorithm may include but not limited to a Backprojection technique, a Filtered Backprojection technique, an Algebraic reconstruction technique, a model-based reconstruction technique (e.g., a machine learning model), and so on. As another example, the image processing module 270-2 may correct the reconstructed MR image, for example, artifact correction, contrast enhancement, noise removal, etc.

In 606, the image processing system 270 may output the processed image. For example, the image processing system 270 may output the processed image via the terminal 130. Merely by way of examples, the processed image may be sent to a display, a printer, a computer network, or the like, or a combination thereof. The output image may include a two-dimensional image, a three-dimensional image, or the like, or any combination thereof.

In 608, the storage module 270-3 may store data generated during the operations 602-606. For example, the stored data may include MR signals, reconstructed MR image, corrected MR image, or the output MR image. In some embodiments, the method to store may include sequential storage, link storage, hash storage, index storage, or the like, or any combination thereof.

It is understood that the image processing system 270 may be implemented on the MRI system 100 or the MRI system 200. One or more operations of the process 600 may be implemented by image processing system 270. The process 600 may be stored in a storage medium (e.g., the storage device 150) of the MRI system 100 in the form of instructions, and invoked and/or executed by the processing device 140. In some embodiments, the process 600 may be accomplished with one or more additional operations not described, and/or without one or more of the operations discussed. Additionally, the order in which the operations of the process 600 as illustrated in FIG. 6 and described above is not intended to be limiting.

Figure 3:
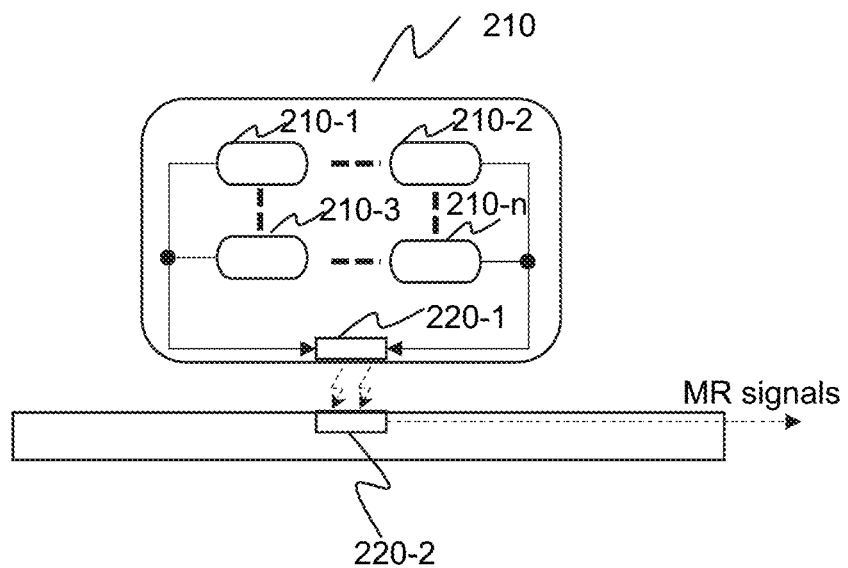
FIG. 3 is a schematic diagram illustrating an exemplary data transmission according to some embodiments of the present disclosure.

FIG. 3 is a schematic diagram illustrating an exemplary data transmission according to some embodiments of the present disclosure. As illustrated in FIG. 3, the RF coil device 210 may include a plurality of RF coil elements, such as 210-1, 210-2, . . . , 210-n. The RF coil elements may be used to detect MR signals from at least one portion of the subject. In some embodiments, at least one portion of the RF coil elements may be selected to detect the MR signals. One or more control circuits may be configured to select the RF coil elements in the RF coil device 210. In some embodiments, the plurality of RF coil elements may include local coils or phased array coils. The local coils may include but not limited to loop coils, rectangular coil, butterfly coil, birdcage coils, transverse electromagnetic (TEM) coils, and saddle coils. It is understood that the geometry of the RF coil elements described above is for illustration purposes not exhaustive and not intended to be limiting.

The MR signals, collected by the at least one portion of the plurality of RF coil elements, may be sent to the coil side data transmitting module 220-1. In some embodiments, the RF coil device 210 may configure with one coil side data transmitting module 220-1 to collect all the MR signals from the at least one portion of the plurality of RF coil elements, as shown in FIG. 3. In some embodiments, the RF coil device 210 may be configured with a plurality of coil side data transmitting modules 220-1 to collect the MR signals from individual RF coil element, which is not shown in FIG. 3. Merely by way of example, each RF coil element may electrically connect to a coil side data transmitting module 220-1, and send the MR signals to corresponding coil side data transmitting module 220-1. For example, the RF coil element 210-1 may be operably connected to a first coil side data transmitting module, the RF coil element 210-2 may be operably connected to a second coil side data transmitting module, the RF coil element 210-3 may be operably connected to a third coil side data transmitting module. The first coil side data transmitting module, the second coil side data transmitting module, and/or the third coil side data transmitting module may be the same as or similar to the coil side data transmitting module 220-1.

In some embodiments, the coil side data transmitting module 220-1 may convert the collected MR signals to electrical signals and/or optical signals. The coil side data transmitting module 220-1 may send the converted signals to the couch side data transmitting module 220-2 via optical and/or electronic wireless communication. The couch side data transmitting module 220-2 may further restore the received signals to the original MR signals, and the restored MR signals may be sent to the image processing system 270 for further processing.

Figure 4A:
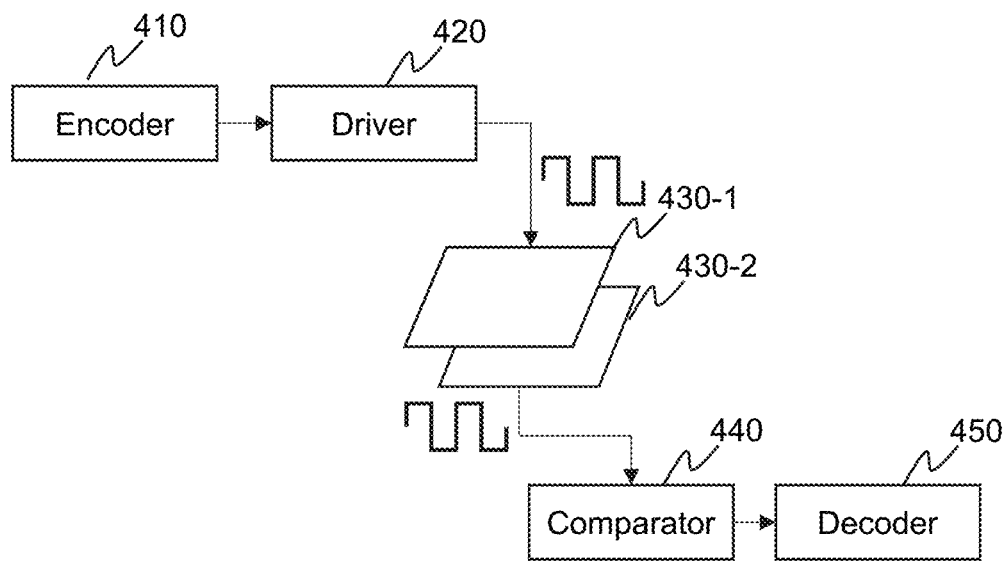
FIG. 4A is a schematic diagram illustrating an exemplary data transmitting module according to some embodiments of the present disclosure.

FIG. 4A illustrates an exemplary data transmitting module/data transmission device according to some embodiments of the present disclosure. Data transmitting module 400 may include a first portion of the data transmitting module (e.g., the coil side data transmitting module), and a second portion of the data transmitting module (e.g., the couch side data transmitting module). As illustrated in FIG. 4A, the first portion of the data transmitting module may include a first capacitor 430-1 operably coupled with an encoder 410 and a driver 420. The second portion of the data transmitting module may include a second capacitor 430-2 operably coupled with a comparator 440 and a decoder 450. As used herein, the encoder 410 and the driver 420 may form a signal converter (e.g., a signal converter 812 illustrated in FIG. 8B). The first capacitor 430-1 may be referred to as a contactless signal transmitter (e.g., a contactless signal transmitter 814 illustrated in FIG. 8B). The second capacitor 430-2 may be referred to as a contactless signal receiver (e.g., a contactless signal receiver 816 illustrated in FIG. 8B). The comparator 440 and the decoder may form a signal resolver (e.g., the signal resolver 818 illustrated in FIG. 8B). In some embodiments, the encoder 410 and the driver 420 may be integrated into the first capacitor 430-1. The comparator 440 and the decoder 450 may be integrated into the second capacitor 430-2. During data transmission, the encoder 410 may encode data to be transmitted as binary data. The driver 420 may transform the binary data to a corresponding waveform signal. An electrical field between the first capacitor 430-1 and the second capacitor 430-2 may be generated. The first capacitor 430-1 may transmit the transformed waveform signal to the second capacitor 430-2 according to a capacitor coupling technology. In some embodiments, the waveform signal may include a rising edge signal and a falling edge signal. The comparator 440 may restore the waveform signal by processing the received rising edge signal and the received falling edge signal. The restored waveform signal may be decoded by the decoder 450. The decoded data may be further processed. The first portion of the data transmitting module may wirelessly transmit the data to the second portion of the data transmitting module via the capacitor coupling technology. In some embodiments, the first capacitor 430-1 and the second capacitor 430-2 may include a pair of a positive capacitor and a negative capacitor. For example, the first capacitor 430-1 may be the positive capacitor, and the second capacitor 430-2 may be the negative capacitor. As another example, the first capacitor 430-1 may be the negative capacitor, and the second capacitor 430-2 may be the positive capacitor. The second capacitor 430-2 and the first capacitor 430-1 may be disposed oppositely and operably coupled with each other. In some embodiments, there is a distance between the second capacitor 430-2 and the first capacitor 430-1. The distance may be short enough as to be able to achieve the data transmission via the capacitor coupling between these two capacitors. It is understood that such the data transmitting module as illustrated in FIG. 4A may be applied to other imaging system or imaging device (e.g., a PET-MR system) so as to achieve wireless data transmission.

Merely by way of example, the one or more RF coil elements of the RF coil device 210 may detect MR signals from the at least portion of the subject. The encoder 410 may encode the detected MR signals as binary data. The driver 420 may transform the binary data to waveform signal. The waveform signal may be wirelessly transmitted to the comparator 440 according to the capacitor coupling. The comparator 440 may restore the waveform signal. The decoder 450 may decode the restored waveform signal, and obtain the MR signals. The MR signals may be transmitted to the image processing system 270 for further processing. For example, the image processing module 270-2 may reconstruct an MR image based on the MR signals.

Figure 4B:
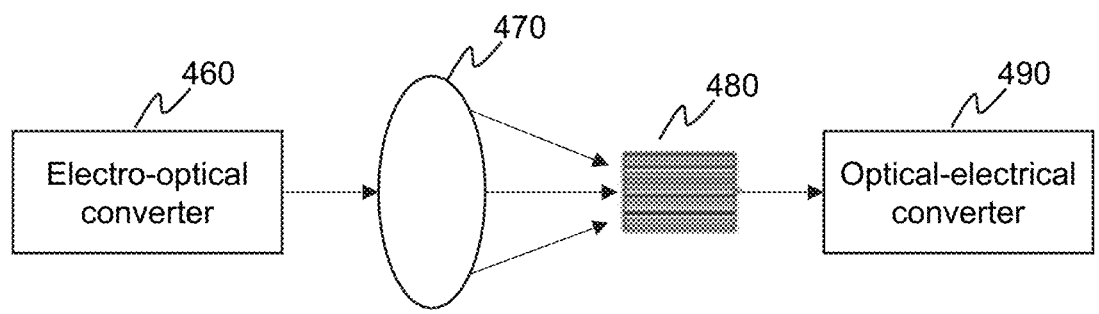
FIG. 4B is a schematic diagram illustrating an exemplary data transmitting module according to some embodiments of the present disclosure.

FIG. 4B illustrates an exemplary data transmitting module/data transmission device according to some embodiments of the present disclosure. As illustrated in FIG. 4B, the first portion of the data transmitting module includes a light emitting element operably coupled with an electrical to optical converter 460 (also referred to as electro-optical converter) and one or more lens 470. The second portion of the data transmitting module includes a light receiving element operably coupled with a fiber bundle 480 and an optical to electrical converter 490 (also referred to as optical-electrical converter). As used herein, the electro-optical converter 460 may be referred to as a signal converter (e.g., the signal converter 812 illustrated in FIG. 8B). The one or more lens may form a contactless signal transmitter (e.g., the contactless signal transmitter 814 illustrated in FIG. 8B). The fiber bundle 480 may form a contactless signal receiver (e.g., the contactless signal receiver 816 illustrated in FIG. 8B). The optical-electrical converter 490 may be referred to as a signal resolver (e.g., the signal resolver 818 illustrated in FIG. 8B). The data transmitting module illustrated in FIG. 4B may achieve the optical wireless communication. In some embodiments, the electro-optical converter 460 may be used to convert electrical signals to optical signals (e.g., a plurality of optical beams). For example, the electro-optical converter 460 may include a laser diode. The laser diode may convert the electrical signals into the plurality of optical beams of different energy levels. The plurality of optical beams may be focused by the one or more lens 470. After passing through the one or more lens 470, the plurality of optical beams may travel to the fiber bundle 480. The optical-electrical converter 490 may convert the plurality of optical beams into electrical signals. The electrical signals may be further processed. The first portion of the data transmitting module may wirelessly transmit the electrical signals to the second portion of the data transmitting module via optical communication. It is understood that such the data transmitting module as illustrated in FIG. 4B may be applied to other imaging system or imaging device (e.g., a PET-MR system) so as to achieve wireless data transmission.

Merely by way of example, the one or more RF coil elements of the RF coil device 210 may detect MR signals from the at least portion of the subject. The MR signals may be in the form of electrical signals. The electro-optical converter 460 may convert the electrical signals indicative of the MR signals to corresponding optical signals. The optical signals may be transformed into a plurality of optical beams. After passing through the one or more lens 470, the plurality of optical beams may travel to the fiber bundle 480. The optical-electrical converter 490 may further convert the plurality of optical beams into electrical signals indicative of the MR signals. The MR signals may be transmitted to the image processing system 270 for further processing. For example, the image processing module 270-2 may reconstruct an MR image based on the MR signals.

In some embodiments, the first portion of the data transmitting module or the second portion of the data transmitting module may include a wireless charging element configured to supply electric power to data transmitting module and/or the RF coils. It should be understood that the RF coils need the electric power to detect the MR signals and that the data transmitting module also needs the electric power to transmit data or signals. The wireless charging element may provide the electric power required by the RF coils and/or the data transmitting module. In some embodiments, the wireless charging element may include one or more induction coils. The one or more induction coils may store electric power from the one or more supply circuits, and discharge the electric power for the RF coils and/or the data transmitting module. In some embodiments, the wireless charging element may be integrated into the RF coil device. For those skilled in the art, the electric power of the RF coils and/or the data transmitting module of the RF coil device may be supplied by a power source or a battery via a plurality of cables. In such configurations, if the RF coil device is adjusted to another position, the plurality of cables may make operations inconvenient. In some embodiments, if the battery is used up, the battery need be replaced and/or removed to be charged. Thus the RF coil device may be disabled for lack of power. Conversely, wireless charging element may supply enough electric power for the RF coil device (e.g., the RF coils and/or the data transmitting module) while avoiding the use of cables and the battery.

FIGS. 5A-5E are exemplary schematic diagrams illustrating exemplary configurations of connecting an RF coil device to a couch according to some embodiments of the present disclosure. In some embodiments, the RF coil device may be detachably connected to the couch. In some embodiments, the RF coil device may move along the table of the couch at any angle (e.g., 0°-90°) and operably connected to various positions on the couch. The RF coil device may be adjusted to a specific position that is suitable for scanning a region of interest (ROI) of the subject. In some embodiments, the RF coil device may be designed based on the ROI being examined. For example, the RF coil device may be a head coil device for detecting MR signals from the head. As another example, the RF coil device may be a spine coil device for detecting MR signals from the spine. Various types of the RF coil devices may be applied.

Figure 5A:
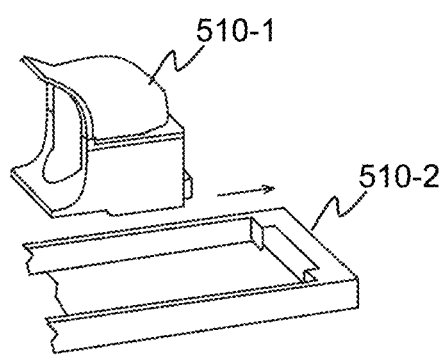
FIGS. 5A-5E are exemplary schematic diagrams illustrating exemplary configurations of connecting an RF coil device to a couch according to some embodiments of the present disclosure.
Figure 5B:
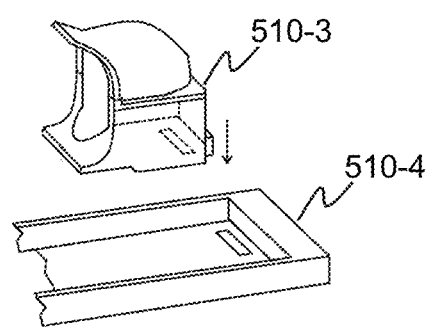
Figure 5C:
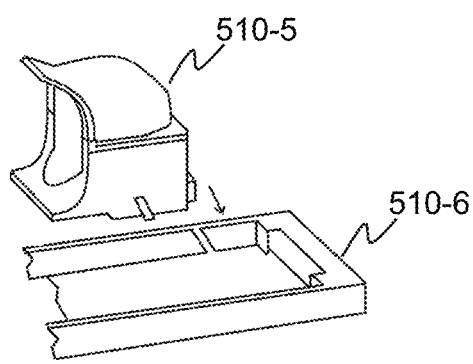
Figure 5D:
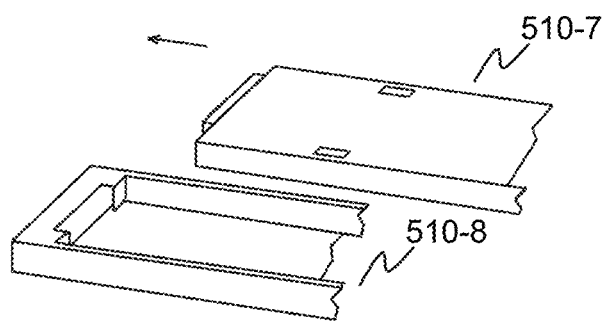
Figure 5E:
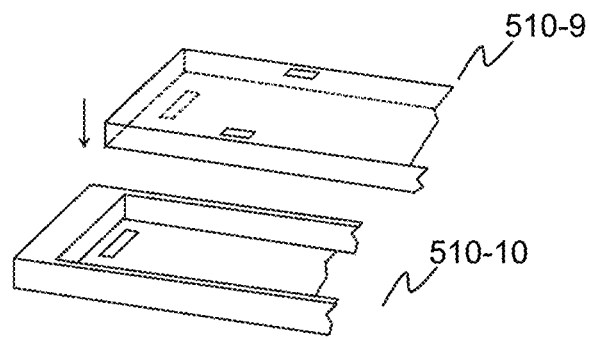

During a scanning, the RF coil device may need to be kept stable on the couch. In some embodiments, the RF coil device may be mechanically connected to the couch via one or more connecting elements. The connecting elements may be one or more of various suitable mechanisms and/or corresponding structural components, and not limiting. As illustrated in FIG. 5A, the connecting element 510-2 may be disposed in the table of the couch device. The connecting element 510-2 may include a guide slot. An end of the guide slot may include a groove. The head coil device 510-1 may slide into the guide slot of the connecting element 510-2 in the horizontal direction so as to connect to the couch device. The connecting element 510-2 may include a convex guide pillar. The convex guide pillar may be clipped into the groove when the head coil device 510-1 slides into the connecting element 510-2. In some embodiments, the guide pillar may be a metallic guide pillar for electrically connected to the couch (e.g., supply circuits coupled to the couch). For example, the supply circuits coupled to the couch may provide electrical energy for the RF coil device via the metallic guide pillar instead of a power source applied to the RF coil device directly. As illustrated in FIG. 5B, the connecting element 510-4 may include a guide slot. The bottom surface of the guide slot may include a hole (e.g., a rectangular hole) for connecting to the head coil device 510-3. The bottom surface of the head coil device 510-3 may include a downward guide pillar. The downward guide pillar may be inserted into the hole when the head coil device 510-3 enters into the connecting element 510-4 in the vertical direction. As illustrated in FIG. 5C, the connecting element 510-6 may include a guide slot. The two side surfaces of the guide slot may include two individual gaps for connecting to the head coil device 510-5. The two side surfaces of the head coil device 510-5 may include two individual connecting pieces. The connecting pieces may be clipped into the gaps, respectively, when the head coil device 510-5 enters into the connecting element 510-6 in the vertical direction. Similar to FIGS. 5A-5C, the spine coil device 510-7 or 510-9 may connect to the corresponding connecting element 510-8 or 510-9. The RF coil device may be clipped into the connecting element in various angles, for example, an angle from 0 degree to 90 degrees. In some embodiments, a position angle of the RF coil device may depend on the angle between the guide slot and the table of the couch device. The angle may range between 0 and 90 degrees. For example, if the angle is 0 degree, the RF coil device is parallel to the table of the couch device. If the angle is 90 degrees, the RF coil device is perpendicular to the table of the couch device. The angle may be set as other angles, such as 30 degrees, 45 degrees, 60 degrees, and so on. It is noted that the RF coil device may be connected to the couch device in one or more of various ways, and the examples described herein are not exhaustive and not limiting.

In some embodiments, the RF coil device may include one or more electric conductors configured to be electrically connected to the couch. The electric conductor may receive electric power from one or more supply circuits disposed inside the couch. The electric conductor may supply the electric power for the RF coil device. For example, the electric conductor may supply the electric power for the wireless charging element of the RF coil device.

Figure 7:
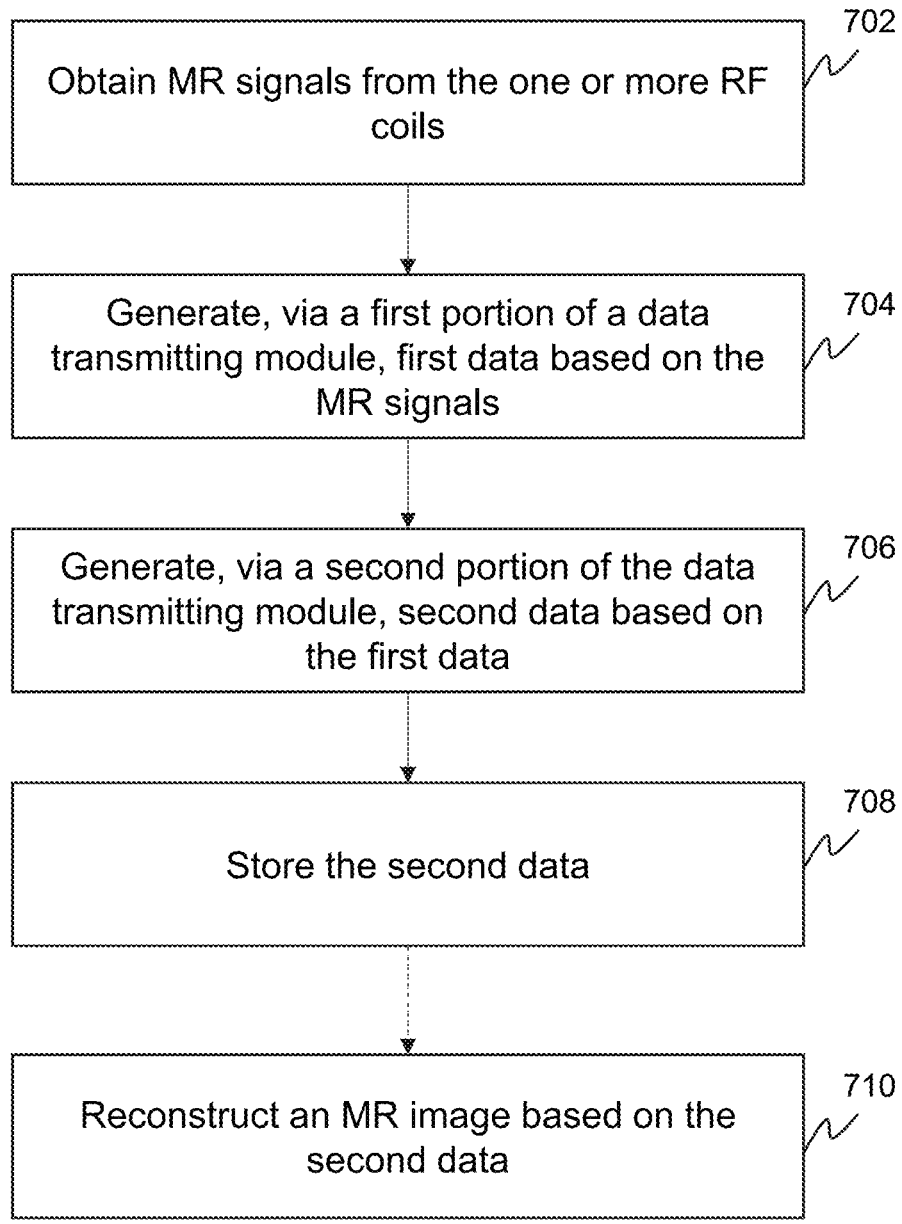
FIG. 7 is a flowchart illustrating an exemplary process of data transmission according to some embodiments of the present disclosure.

FIG. 7 is a flowchart illustrating an exemplary process of data transmission according to according to some embodiments of the present disclosure. One or more operations of process 700 may be implemented in MRI system 100 or 200. For example, the process 700 may be stored in a storage medium (e.g., the storage device 150) of the MRI system 100 in the form of instructions, and invoked and/or executed by the processing device 140. In some embodiments, the process 700 may be accomplished with one or more additional operations not described, and/or without one or more of the operations discussed. Additionally, the order in which the operations of the process 700 as illustrated in FIG. 7 and described above is not intended to be limiting.

In 702, MR signals from one or more RF coils may be obtained. In some embodiments, an RF coil device (e.g., the RF coil device 210, the head coil device 510-1) may be used to detect the MR signals from at least one portion of a subject loaded on the couch. The RF coil device may include the one or more RF coils. During a scanning of the subject, the processing device 140 may direct the RF coil device to detect the MR signals.

In 704, first data may be generated by a first portion of a data transmitting module. In some embodiments, the processing device 140 may direct the first portion of the data transmitting module to generate the first data. The first portion of the data transmitting module may be disposed in the RF coil device. The first portion of the data transmitting module may receive the MR signals. The first portion of the data transmitting module may transform the MR signals to the first data. The first data may include electrical signals and/or optical signals. For example, as illustrated in FIG. 4A, the first portion of the data transmitting module may include a first capacitor 430-1 coupled with an encoder 410 and a driver 420. The encoder 410 may encode the detected MR signals as binary data. The driver 420 may transform the binary data to waveform signal. The first data may include the binary data and/or the waveform signal. As another example, as illustrated in FIG. 4B, the first portion of the data transmitting module may include a light emitting element operably coupled with an electro-optical converter 460 and one or more lens 470. The electro-optical converter 460 may be used to convert electrical signals to optical signals. The first data may include the optical signals.

In 706, second data may be generated via a second portion of the data transmitting module. In some embodiments, the processing device 140 may direct the second portion of the data transmitting module to generate the second data. In some embodiments, the second portion of the data transmitting module may connect to the first portion of the data transmitting module via an optical or electronic wireless communication. The first data may be wirelessly transmitted to the second portion of the data transmitting module. The second portion of the data transmitting module may be disposed in the couch. In some embodiments, as illustrated in FIG. 4A, the second portion of the data transmitting module may include a second capacitor 430-2 coupled with a comparator 440 and a decoder 450. The comparator 440 may restore the waveform signal included in the first data. The restored waveform signal may be decoded by the decoder 450. The second data may be the decoded data, that is, the MR signals. In some embodiments, as illustrated in FIG. 4B, the second portion of the data transmitting module may include a light receiving element operably coupled with a fiber bundle 480 and an optical-electrical converter 490. The fiber bundle 480 may transmit the received optical signals included in the first data to the optical-electrical converter 490. The optical-electrical converter 490 may convert the optical signals into the electrical signals. The electrical signals may be indicative of the MR signals, that is, the second data.

In 708, the second data (i.e., the MR signals) may be stored in a non-transitory computer-readable storage medium (e.g., the storage device 150). In some embodiments, the second data may be used to reconstruct an MR image, as illustrated in 710. For example, the image processing module 270-2 may reconstruct an MR image by using the second data according to one or more reconstruction algorithms. The reconstruction algorithm may include but not limited to a Backprojection technique, a Filtered Backprojection technique, an Algebraic reconstruction technique, a model-based reconstruction technique (e.g., a machine learning model), and so on.

It should be noted that the description of the process 700 is provided for the purposes of illustration, and not intended to limit the scope of the present disclosure. For persons having ordinary skills in the art, various variations and modifications may be conducted under the teaching of the present disclosure. For example, operations 704 and 706 may be integrated into a single operation. As another example, operation 708 may be omitted. However, those variations and modifications may not depart from the protecting of the present disclosure.

Figure 8A:
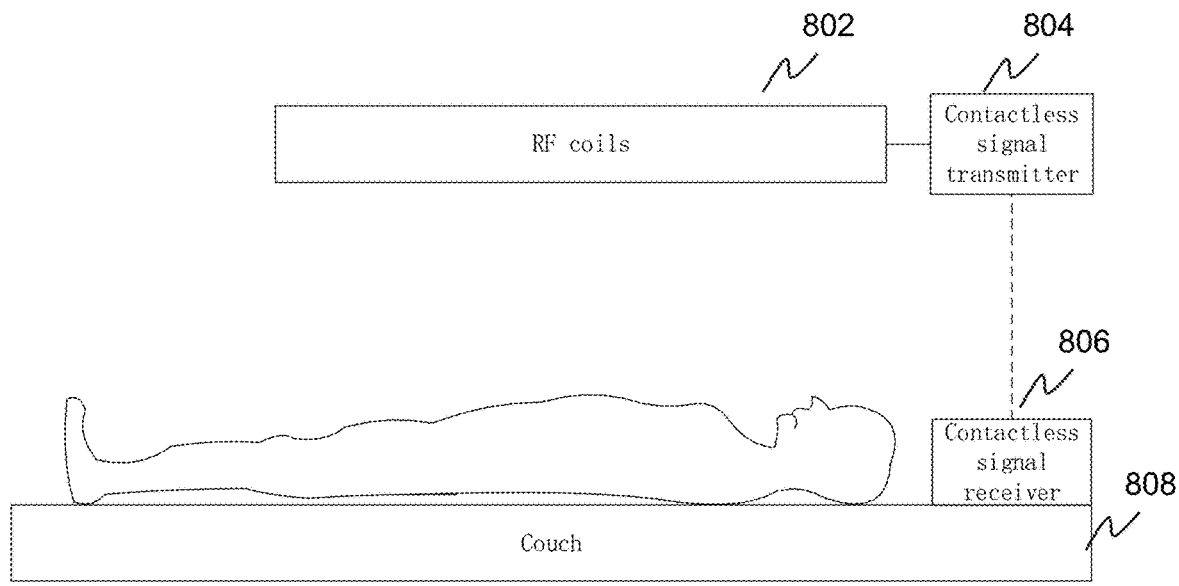
FIGS. 8A and 8B are schematic diagrams illustrating exemplary MRI devices according to some embodiments of the present disclosure.

FIG. 8A is a schematic diagram illustrating an exemplary MRI device according to some embodiments of the present disclosure. As illustrated in FIG. 8A, MR device 800 may at least include one or more RF coils 802, a contactless signal transmitter 804, a contactless signal receiver 806, and a couch 808. The couch 808 may be configured to support a subject, which is the same as or similar to the couch 118 illustrated in FIG. 1. In some embodiments, the one or more RF coils may include local coils or phased array coils. The one or more RF coils may be configured to detect or receive MR signals from at least one portion of the subject emitted by RF pulses. In some embodiments, the one or more RF coils may be arranged in an RF coil device (e.g., the RF coil device 210 illustrated in FIG. 2) connected to the couch 808. In some embodiments, the contactless signal transmitter 804 may be disposed in the one or more RF coils. In some embodiments, each of the one or more RF coils may be operably coupled to an individual contactless signal transmitter 804. In some embodiments, at least one portion of the one or more coils may be operably coupled to an individual contactless signal transmitter 804. In some embodiments, all the RF coils may be operably coupled to an individual contactless signal transmitter 804. The number (or count) of the contactless signal transmitter 804 may vary, and not limiting. In some embodiments, the contactless signal receiver 806 may be disposed in the couch 808. In some embodiments, each contactless signal transmitter 804 may connect wirelessly to a contactless signal receiver 806. In some embodiments, the contactless signal transmitter 804 may send the MR signals to the contactless signal receiver according to an induced electrical field or optical field between them. In some embodiments, an MR image may be reconstructed by an image processing system (e.g., the image processing system 270) according to the MR signals from the contactless signal receiver 806. In some embodiments, the contactless signal transmitter 804 may be the same as or similar to the first portion of the data transmitting module 220-1 (or the coil side data transmitting module) as illustrated in FIG. 2, and not be described repeatedly. In some embodiments, the contactless signal transmitter 804 may include a WIFI transmitter, and the contactless signal receiver 806 may include a WIFI receiver. In some embodiments, the contactless signal transmitter 804 may include an NFC transmitter, and the contactless signal receiver 806 may include an NFC receiver.

Figure 8B:
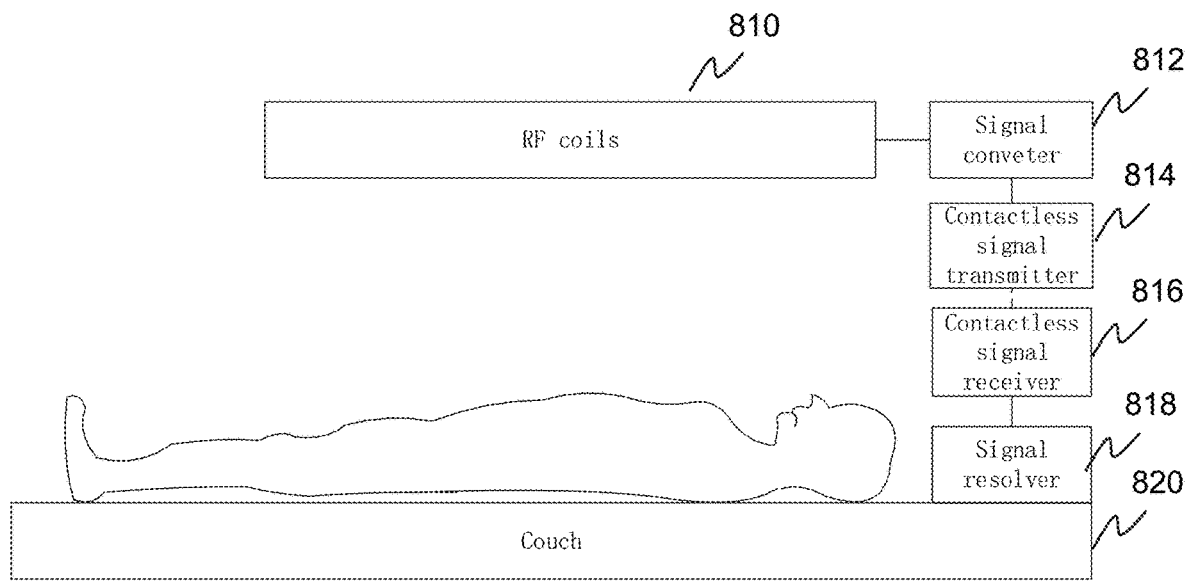

FIG. 8B is a schematic diagram illustrating an exemplary MRI device according to some embodiments of the present disclosure. As illustrated in FIG. 8B, the MR device 800 may include one or more RF coils 810, a signal converter 812, a contactless signal transmitter 814, a contactless signal receiver 816, a signal resolver 818, and a couch 820. The signal converter 812 and the contactless signal transmitter 814 may be operably coupled with the one or more RF coils 810. For example, each of the one or more RF coils may be operably coupled to a pair of the signal converter 812 and the contactless signal transmitter 814. As another example, at least one portion of the one or more RF coils may be operably coupled to a pair of the signal converter 812 and the contactless signal transmitter 814. As a further example, all of the one or more RF coils may be operably coupled to a pair of the signal converter 812 and the contactless signal transmitter 814. The signal converter 812 may be configured to convert the MR signals detected by the RF coil(s) to first signals (e.g., first data illustrated in FIG. 8). The contactless signal transmitter 814 may send the first signals to the contactless signal receiver 816 via wireless communication. The contactless signal receiver 816 may send the received first signals to the signal resolver 818. The signal resolver 818 may be configured to resolve the first signal to restore the MR signals.

In some embodiments, the contactless signal transmitter 814 may include a first capacitor (e.g., the first capacitor 430-1 illustrated in FIG. 4A), and the contactless signal receiver 816 may include a second capacitor corresponding to the first capacitor (e.g., the second capacitor 430-2 illustrated in FIG. 4A). When the first capacitor and the second capacitor are supplied with power, an induced electrical field between them may be generated. The converted first signals may be further wirelessly send to the contactless signal receiver 816 via the induced electrical field.

In some embodiments, the signal converter 812 may include an encoder (e.g., the encoder 410 illustrated in FIG. 4A) and a driver (e.g., the driver 420 illustrated in FIG. 4A). The encoder may be configured to transform an MR signal detected by the RF coil to binary data. The driver may generate a waveform signal corresponding to the binary data, and send the waveform signal to the first capacitor.

In some embodiments, the signal resolver 818 may include a compactor (e.g., the comparator 440 illustrated in FIG. 4A) and a decoder (e.g., the decoder 450 illustrated in FIG. 4A). The comparator 440 may be configured to restore the waveform signals received by the second capacitor to digital signals. The decoder 450 may be configured to decode the digital signals to obtain the MR signals.

In some embodiments, the signal converter 812 may include an electro-optical converter (e.g., the electro-optical converter 460 illustrated in FIG. 4B). The contactless signal transmitter 814 may include one or more lens (e.g., the one or more lens 470 illustrated in FIG. 4B). The contactless signal receiver 816 may include a fiber bundle (e.g., the fiber bundle 480 illustrated in FIG. 4B). The signal resolver 818 may include an optical-electrical converter (e.g., the optical-electrical converter 490 illustrated in FIG. 4B). Specifically, the electro-optical converter may be configured to convert the MR signals to optical signals (e.g., optical beams). The one or more lens may focus the optical beams before the optical beams travel to the fiber bundle. The fiber bundle may be configured to transmit the focused optical beams.

The optical-electrical converter may be configured to convert the focused optical beams to electrical signals indicative of the MR signals.

In some embodiments, an RF coil device including the one or more RF coils 810 may be detachably connected to the couch. For example, the RF coil device may be connected to a connecting element disposed in the couch, as illustrated in FIGS. 5A-5E. The RF coil device may be clipped into the connecting element in various angles, for example, an angle from 0 degrees to 90 degrees. In some embodiments, the RF coil device may include one or more electric conductors to be electrically connected to the couch. In some embodiments, the RF coil device may include a wireless charging element. The wireless charging element may include one or more induction coils for charging the one or more RF coils, the contactless signal transmitter and/or the contactless signal receiver.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure, and are within the spirit and scope of the exemplary embodiments of the present disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, radio frequency (RF), or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to surface modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

I claim:

1. A system implemented on a magnetic resonance imaging (MRI) device including a radio frequency (RF) coil device containing one or more RF coils configured to detect magnetic resonance (MR) signals, and a couch configured to support at least portion of a subject, comprising
    a storage device including a set of instructions;
    a data transmitting module configured to transmit the MR signals; and
    at least one processor in communication with the storage device and the data transmitting module, wherein when executing the set of instructions, the at least one processor is configured to direct the system to perform operations including:
        obtaining the MR signals from the one or more RF coils;
        generating, via a first portion of the data transmitting module, first data based on the MR signals;
        generating, via a second portion of the data transmitting module, second data based on the first data; and
        storing the second data in a non-transitory computer-readable storage medium, wherein the first portion of the data transmitting module is disposed in the RF coil device, wherein the second portion of the data transmitting module is disposed in the couch, and wherein the first portion of the data transmitting module and the second portion of the data transmitting module induce an electrical field or an optical field for transmitting the first data from the first portion of the data transmitting module to the second portion of the data transmitting module.

2. A data transmission device connected to a magnetic resonance imaging (MRI) device, comprising:
    a signal converter for converting MR signals from an RF coil device including one or more radio frequency (RF) coils;
    a contactless signal transmitter for wirelessly transmitting the converted signals to a contactless signal receiver;
    the contactless signal receiver for transmitting the received converted signals to a signal resolver; and
    the signal resolver for resolving the converted signals to obtain the MR signals, wherein
    the signal converter is connected to the one or more RF coils and the contactless signal transmitter,
    the contactless signal receiver is connected to the signal resolver,
    the signal converter and the contactless signal transmitter are coupled to the RF coil device,
    the contactless signal receiver and the signal resolver are coupled to a couch, wherein the signal converter and the contactless signal transmitter are disposed in the RF coil device, wherein the contactless signal receiver and the signal resolver are disposed in the couch, and wherein the contactless signal transmitter and the contactless signal receiver induce an electrical field or an optical field for transmitting the converted signal from the contactless signal transmitter to the contactless signal receiver.

3. A magnetic resonance imaging (MRI) device, comprising:
    a couch for supporting a subject;
    a radio frequency (RF) coil device for detecting MR signals from at least one portion of the subject, wherein the RF coil device includes one or more RF coils, and the RF coil device is detachably connected to the couch;
    a contactless signal transmitter disposed in the RF coil device; and
    a contactless signal receiver disposed in the couch,
    wherein the contactless signal transmitter is configured to transmit the MR signals to the contactless signal receiver according to an electrical field or an optical field induced by the contactless signal transmitter and the contactless signal receiver.

4. The system of claim 1, wherein the at least one processor is further configured to direct the system to perform additional operations including:
    transmitting the second data to an image processing module connected to the MRI device, the image processing module being configured to reconstruct an MR image of the at least portion of the subject based on the second data.

5. The system of claim 1, wherein the second portion of the data transmitting module connects to the first portion of the data transmitting module via optical wireless communication or electronic wireless communication based on the electrical field or the optical field.

6. The system of claim 1, wherein the first portion of the data transmitting module includes a first capacitor coupled with an encoder and a driver; the second portion of the data transmitting module includes a second capacitor coupled with a comparator and a decoder, and the second capacitor and the first capacitor are disposed oppositely and operably coupled with each other.

7. The system of claim 1, wherein the first portion of the data transmitting module includes a light emitting element operably coupled with an electrical to optical converter and one or more lens, and the second portion of the data transmitting module includes a light receiving element operably coupled with a fiber bundle and an optical to electrical converter.

8. The system of claim 1, wherein the first portion of the data transmitting module is operably connected to each of the one or more RF coils, and the first portion of the data transmitting module is coupled to the RF coil device.

9. The system of claim 8, wherein the RF coil device moves along a table of the couch at any angle and is detachably connected to the couch.

10. The system of claim 9, wherein the RF coil device is connected to the couch via a connecting element having a guide slot, wherein an angle between the guide slot and the table of the couch ranges from 0 degree to 90 degrees.

11. The system of claim 10, wherein the RF coil device is electrically connected to the couch via the metallic guide pillar.

12. The system of claim 1, wherein the first portion of the data transmitting module or the second portion of the data transmitting module further includes a wireless charging element configured to supply electric power to data transmitting module or the RF coils.

13. The device of claim 2, wherein the contactless signal transmitter includes a first capacitor and the contactless signal receiver includes a second capacitor, wherein
the converted signals are wirelessly transmitted under the induced electrical field between the first capacitor and the second capacitor.

14. The device of claim 13, wherein the signal converter includes an encoder and a driver, wherein
the encoder is configured to convert the MR signals to binary data; and
the driver is configured to generate waveform signals corresponding to the binary data, and transmit the waveform signals to the first capacitor.

15. The device of claim 14, wherein the signal resolver includes a comparator and a decoder, wherein
the comparator is configured to restore the waveform signals from the second capacitor to digital signals; and
the decoder is configured to resolve the digital signals to obtain the MR signals.

16. The device of claim 2, wherein the signal converter includes an electrical to optical converter, the contactless signal transmitter includes one or more lens, the contactless signal receiver includes a fiber bundle, and the signal resolver includes an optical to electrical converter; wherein
the electrical to optical converter is configured to convert the MR signals to optical signals;
the one or more lens are configured to focus the optical signals;
the fiber bundle is configured to transmit the focused optical signals; and
the optical to electrical converter is configured to convert the focused optical signals to electrical signals indicative of the MR signals.

17. The device of claim 2, wherein the RF coil device is detachably connected to the couch.

18. The device of claim 2, wherein the RF coil device includes one or more electric conductors configured to electrically connect to the couch.

19. The MRI device of claim 3, wherein the MRI device further includes a signal converter disposed in the RF coil device and a signal resolver disposed in the couch, wherein
the signal converter is configured to convert MR signals from one or more RF coils;
the contactless signal transmitter is configured to wirelessly transmit the converted signals to the contactless signal receiver;
the contactless signal receiver is configured to transmit the received converted signals to the signal resolver; and
the signal resolver is configured to resolve the received converted signals to obtain the MR signals.

\* \* \* \* \*